(12) United States Patent
Mimlitch, III et al.

(10) Patent No.: US 7,806,277 B2
(45) Date of Patent: Oct. 5, 2010

(54) SLIDING RACK-MOUNTABLE SHELF FOR RACK-MOUNTABLE COMPONENTS

(75) Inventors: Robert H. Mimlitch, III, Rowlett, TX (US); David Anthony Norman, Greenville, TX (US)

(73) Assignee: Innovation First, Inc., Greenville, TX (US)

( * ) Notice: Subject to any disclaimer, the term of this patent is extended or adjusted under 35 U.S.C. 154(b) by 0 days.

(21) Appl. No.: 11/681,132

(22) Filed: Mar. 1, 2007

(65) Prior Publication Data

US 2007/0227992 A1 Oct. 4, 2007

Related U.S. Application Data

(63) Continuation of application No. 10/622,402, filed on Jul. 18, 2003, now Pat. No. 7,201,279.

(60) Provisional application No. 60/396,759, filed on Jul. 18, 2002.

(51) Int. Cl.
*A47F 7/00* (2006.01)
(52) U.S. Cl. ...................................................... 211/26
(58) Field of Classification Search .................. 211/26, 211/175, 190, 126.15, 134, 187, 189; 361/826, 361/725, 727; 312/223.1, 334.4, 334.5, 334.7, 312/334.8, 265.4
See application file for complete search history.

(56) References Cited

U.S. PATENT DOCUMENTS

| | | | |
|---|---|---|---|
| 5,215,362 A | 6/1993 | Zoellner | |
| 5,340,340 A | 8/1994 | Hastings et al. | |
| 5,351,176 A | 9/1994 | Smith et al. | |
| 5,542,549 A | 8/1996 | Siemon et al. | |
| 5,772,294 A | 6/1998 | Hendrich et al. | |
| 5,833,337 A * | 11/1998 | Kofstad | 312/334.5 |
| 5,873,641 A | 2/1999 | Spinelli | |
| 5,941,621 A | 8/1999 | Boulay et al. | |
| 6,021,909 A | 2/2000 | Tang et al. | |
| 6,142,590 A | 11/2000 | Harwell | |
| 6,170,784 B1 | 1/2001 | MacDonald et al. | |
| 6,201,690 B1 | 3/2001 | Moore et al. | |
| 6,220,456 B1 | 4/2001 | Jensen et al. | |
| 6,227,630 B1 | 5/2001 | Brown et al. | |
| 6,230,903 B1 * | 5/2001 | Abbott | 211/26 |

(Continued)

OTHER PUBLICATIONS

Chatworth Products, Inc., www.chatsworth.com, Dell Rack-Mount Server Solutions, Form No. MKT—600020-061-CH, Dec. 2001 (2 pages).

*Primary Examiner*—Jennifer E. Novosad
(74) *Attorney, Agent, or Firm*—Fish & Richardson P.C.

(57) ABSTRACT

A sliding support shelf supports equipment within a rack system regardless of its design. The base of the support shelf includes a surface capable of supporting the equipment reducing unintended movement of the equipment, providing security of the supported equipment, and enhancing ventilation of the equipment. A slide is associated with the base to allow the base to move with respect to the rack. The slide lacks ball bearings, but provides smooth movement of the base without requiring direct attachment to the equipment. Cable management arms are integral to the base to manage the various cables and the like associated with the equipment. The method of the present invention comprises steps of use of the support shelf with various designs of racks and types and dimensions of equipment to be supported.

10 Claims, 11 Drawing Sheets

U.S. PATENT DOCUMENTS

| | | | |
|---|---|---|---|
| 6,254,041 | B1 | 7/2001 | Dufourg |
| 6,349,837 | B1 | 2/2002 | Serban |
| 6,370,022 | B1 | 4/2002 | Hooper et al. |
| 6,422,399 | B1 | 7/2002 | Castillo et al. |
| 6,431,668 | B1 | 8/2002 | Redicliffe |
| 6,442,020 | B1 | 8/2002 | Liu et al. |
| 6,490,153 | B1 | 12/2002 | Casebolt et al. |
| 6,556,432 | B2 | 4/2003 | Chen et al. |
| 6,644,481 | B2 | 11/2003 | Dean et al. |
| 6,655,534 | B2 | 12/2003 | Williams et al. |
| 6,719,149 | B2 | 4/2004 | Tomino |
| 6,739,682 | B2 | 5/2004 | Shih |
| 6,974,037 | B2 | 12/2005 | Haney |
| 6,988,626 | B2 | 1/2006 | Varghese et al. |
| 7,134,558 | B1 | 11/2006 | Mimlitch, III et al. |
| 7,201,279 | B1 * | 4/2007 | Mimlitch et al. ............... 211/26 |
| 7,275,646 | B2 | 10/2007 | Mimlitch, III et al. |
| 7,591,056 | B2 | 9/2009 | Mimlitch, III et al. |
| 2001/0040142 | A1 | 11/2001 | Haney |
| 2001/0040203 | A1 * | 11/2001 | Brock et al. ............ 248/222.11 |
| 2002/0043508 | A1 | 4/2002 | Lewis |
| 2003/0019822 | A1 | 1/2003 | Liu |
| 2003/0019823 | A1 | 1/2003 | Corbett, Jr. et al. |
| 2003/0205539 | A1 | 11/2003 | Lauchner et al. |
| 2005/0285493 | A1 * | 12/2005 | Hu et al. ................... 312/334.4 |
| 2007/0131628 | A1 | 6/2007 | Mimlitch, III et al. |
| 2008/0175659 | A1 | 7/2008 | Mimlitch, III et al. |

* cited by examiner

Step 10 – select design of rack system

Step 20 – selection of orientation of the base to accommodate width of the load to be supported Step 30 – if a two-post design is selected in Step 10 above, then utilize a conversion bracket to mount the base in either a centered or flushed position with respect to the rack system Step 40 – placing a load on the base to be supported Step 50 – optionally, coupling cables associated with the load to be supported to means for cable management

FIGURE 12

SLIDING RACK-MOUNTABLE SHELF FOR RACK-MOUNTABLE COMPONENTS

CROSS-REFERENCE TO RELATED APPLICATIONS

This application is a continuation of U.S. patent application Ser. No. 10/622,402 filed on Jul. 18, 2003, now U.S. Pat. No. 7,201,279, which claims the benefit of U.S. Provisional Patent Application No. 60/396,759, filed Jul. 18, 2002, all of which are incorporated herein by reference.

TECHNICAL FIELD

The present invention relates to support racks, and more particularly to a sliding apparatus and method for supporting equipment, such as electronic equipment.

BACKGROUND

The use of traditional fixed shelves to support electronic components or equipment not designed or modified for coupling with equipment racks has traditionally been problematic from an equipment configuration and maintenance standpoint. Such electronic equipment includes traditional personal computers or other standalone devices that are not configured to be coupled to rack slides as understood in the art. In the case of configuring electronic equipment not designed or modified for coupling to equipment racks, fixed shelving does not provide installation convenience for a number of reasons. For example, installing moderately heavy equipment (e.g., between 20 and 40 pounds) is difficult as it can be awkward to lift or place the equipment into a rack having a fixed shelf. To conserve rack space, which is premium, shelves are generally spaced as closely together as possible. Existing fixed shelves also lack cable management and fail to provide any means to couple equipment to the shelf Existing sliding shelf options also suffer from several drawbacks. For example, such options generally fail to extend a sufficient length to allow access to the electronic components to be coupled thereon. Ideally, a shelf should extend several inches past the depth of the component to be supported so that access to the rear of the component and associated cables is provided. Additionally, the few options that provide extended sliding length are cost prohibitive for mounting the instant electronic equipment. It is not practical to expend a multiple of the costs associated with the equipment to be supported within the rack on the sliding shelf itself.

As a result, there remains a need for a rack mountable shelf capable of coupling to a two-or four-post rack and supporting computers or other electronic equipment not adapted or configured to be coupled to traditional rack mountable sliding shelves.

SUMMARY

The support shelf of the present invention includes a base portion having a support surface adapted to support electronic equipment, such as a personal computer. The base portion includes an integral handle for moving the base portion relative to slide sections coupled to the base portion. Optional slots or holes are provided on the support surface to serve several functions. For example, such openings provide weight reduction, versatility of shelf orientation, component stability/security and increased ventilation.

The support shelf of the present invention provides a number advantages over fixed shelf, and even existing sliding shelf, options, including versatility (the shelf can be flipped along a central axis to provide optimum spacing options); universality (the shelf can be used with both 2-post and 4-post rack systems); low cost (the shelf includes non-ball bearing slides), cable management (movable arms allow cable movement with shelf movement), and ease of maintenance.

The details of one or more embodiments of the present invention are set forth in the accompanying drawings and the description below. Other features, objects, and advantages of the invention will be apparent from the description and drawings, and from the claims.

DESCRIPTION OF DRAWINGS

FIG. 12 is a flowchart illustrating the steps of the present invention method of utilizing a support shelf of the present invention.

Like reference symbols in the various drawings indicate like elements.

DETAILED DESCRIPTION

Various embodiments of the principles of the present invention are shown in FIGS. 1-12. The present invention comprises a sliding support shelf, and associated method for use of same, for electronic and related components to be supported in either two-post or four-post rack systems of various configurations. The sliding support shelf of the present invention is designed to provide support and security for components not adapted or configured for use with rack systems, such as desktop computers, tower computers, tape drives, hubs, switches and the like.

Figure 1:
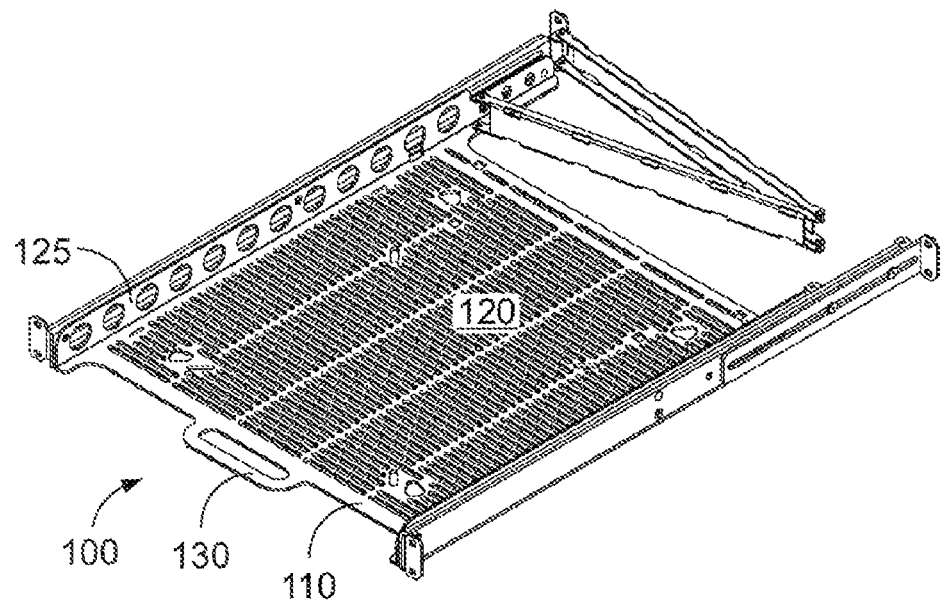
FIG. 1 is a perspective view of an embodiment of the sliding support shelf of the present invention.

As illustrated in FIG. 1, the support shelf 100 of present invention comprises a base 110 having a support surface 120 adapted to support electronic equipment (not shown), such as a personal computer, and inner side rails 125 on either side of the base 110. The base 110 may include an optional integral handle 130 for moving the base 110 relative to the rack.

Figure 2:
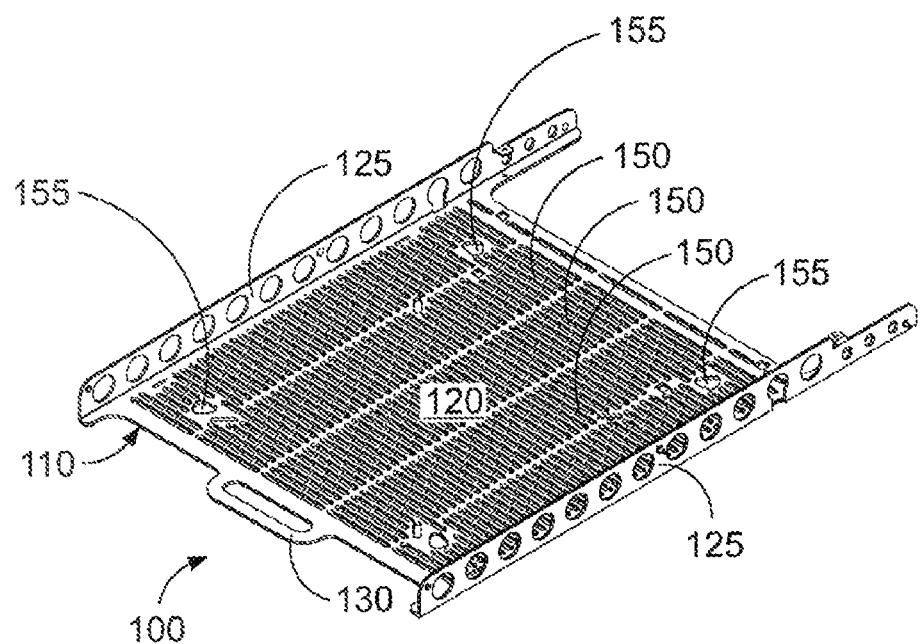
FIG. 2 is a perspective view of the base of an embodiment of the sliding support shelf of the present invention including openings.

As illustrated in FIG. 2, one or more openings 150, such as slots or holes, may be provided on the support surface 120 to serve one or more of several functions. First, the openings 150 reduce the overall weight of the shelf 100. Second, the openings 150 may be orientated in a right-to-left or left-to-right direction, which increases the front-to-back friction between the shelf and the "feet" of the equipment supported thereon. The orientation of the openings 150 further serves to reduce the likelihood of equipment inadvertently moving or sliding around on the shelf 100. Additionally, the openings 150 may be oriented in a front-to-back direction to allow equipment to be coupled to the shelf 100 via straps or other coupling mechanisms. The coupling of equipment to the shelf 100 may be desirable in regions prone to structural shifting and the like. Additionally, holes 155 may be provided within the base 110 to correspond to the location and size of feet associated with specific equipment models, if desired, to further limit lateral movement of equipment supported by the support shelf 100. The openings 150 may be positioned conceivably anywhere on the base 110 to provide for coupling locations of the computers or electronic components. Pre-determined patterns may be used to correspond with the dimensions of various equipment components from different manufacturers.

The openings 150, with the optional assistance of tabs, straps and the like, further serve to prevent the electronic component from moving after coupling to the base 110. Anti-slip pads (not shown) also may be placed on the base 110 to increase friction between the support surface 120 and the electronic component coupled thereto. Ventilation is accomplished, in part, via the openings 150 within the support surface 120 of the base 110.

Figure 3:
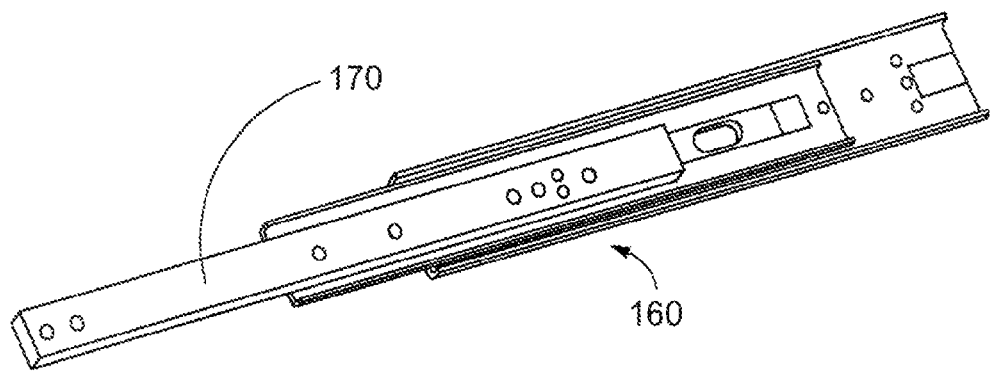
FIG. 3 is a three-piece slide representative of existing prior art sliding shelves.
Figure 4:
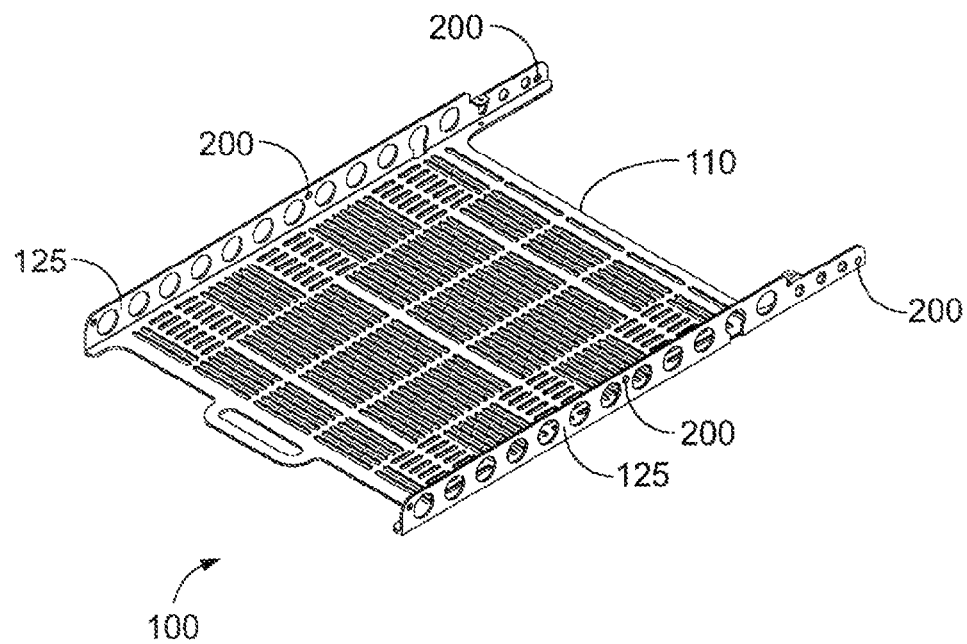
FIG. 4 is a perspective view of the base of an embodiment of the sliding support shelf of the present invention including strap slots.
Figure 5:
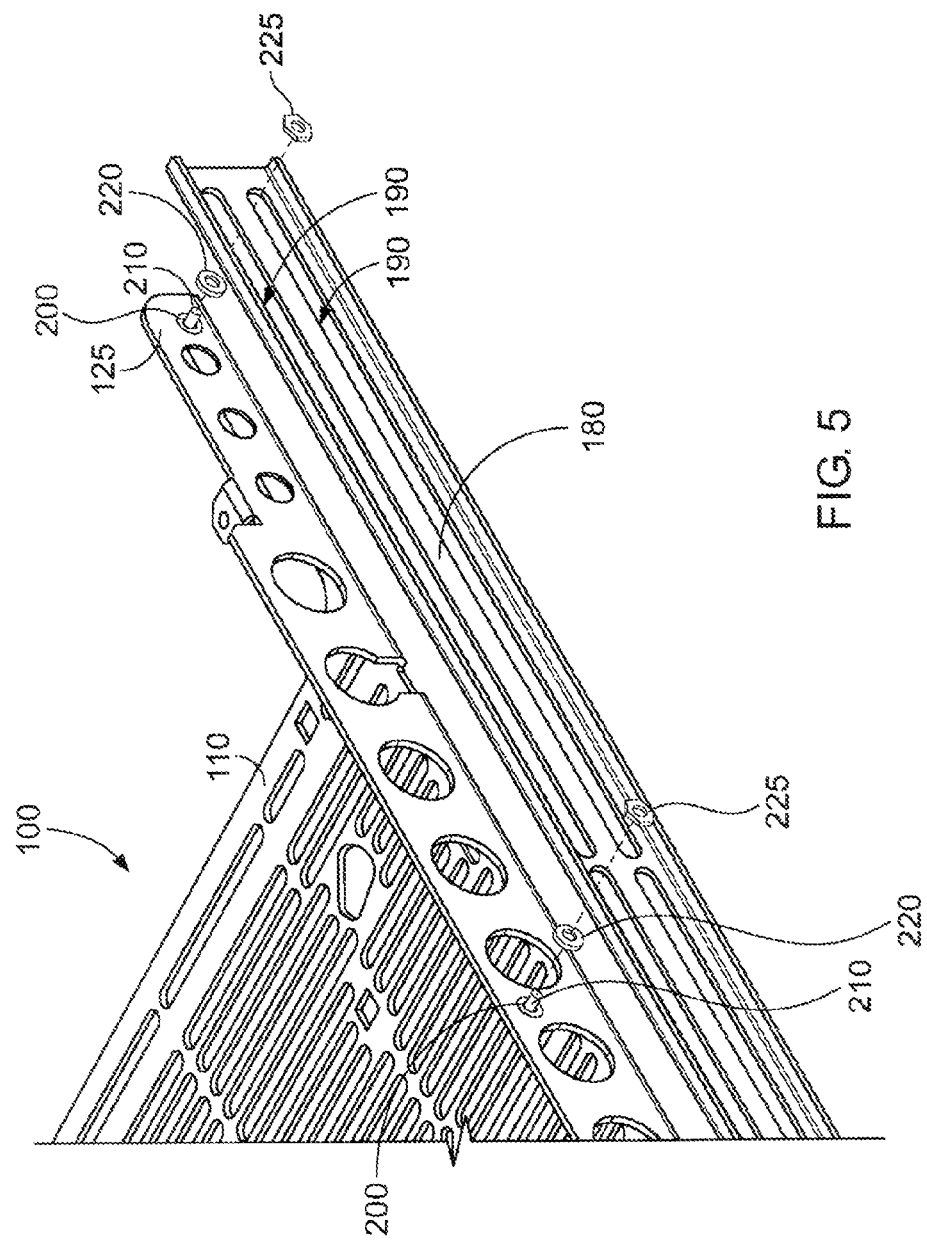
FIG. 5 is an exploded view of an embodiment of the sliding support shelf of the present invention, illustrating the attachment of the slides to the base.

Now referring to FIG. 3, there is shown a three-piece slide 160 representative of existing prior art slides for use with shelves and the like. In typical prior art sliding shelf systems, the slide 160 is a component purchased separately and coupled to the shelf to provide the shelf the ability to slide with respect to the rack. Such prior art slides use ball bearings to ensure smooth movement of the shelf with respect to the rack. Installation of a prior art slide requires that an inner slide section 170 be attached to the outside of the equipment component to be supported, and additional brackets (not shown) be attached to the outer section of the rack. Such a prior art slide 170 adds substantial cost to sliding shelf systems and employs ball-bearing slides that are designed for significantly more sliding cycles (in-and-out) than is needed for electronics racking applications, requiring production labor and cost for screws, rivets, or other mechanical attachment, Now referring to FIGS. 4 and 5, a center slide member 180 of the present invention support shelf 100 includes slide slots 190 along its length. Two of the slide slots 190 are used in coupling the center slide member 180 to the inner slide rails 125 while allowing the center slide member 180 to translate with respect to base 110. The inner slide rails 125 are also provided with one or more, and preferably two, holes 200, preferably centrally located along the length of the inner slide rails 125, and another preferably located near the rear of the base 110. The holes 200 allow coupling of the inner slide rails 125 to the center slide member 180 via suitable fasteners. In a preferred embodiment, the suitable fasteners include a screw 210, a spacer washer 220, and a shoulder washer 225. The spacer washer 220 and the shoulder washer 225 are preferably made of a low friction material (e.g., brass). The spacer washer 220 is used between the center slide member 180 and the inner slide rails 125 to provide sufficient spacing to allow the center slide member 180 to move with respect to the inner slide rails 125 of the base 110. The shoulder washer 225, when threaded to mate with screw 210, slides within the slot 190, and couples the center slide member 180 to the inner slide member 125.

Figure 6A:
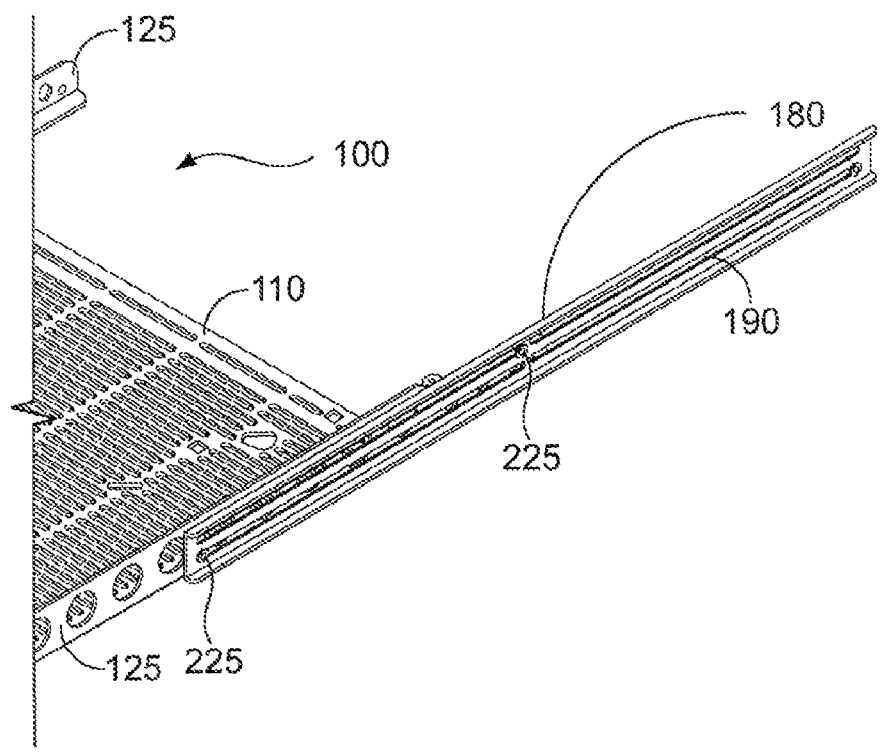
FIG. 6A is a perspective view of an embodiment of the sliding support shelf of the present invention illustrating the shelf in an extended position.
Figure 6B:
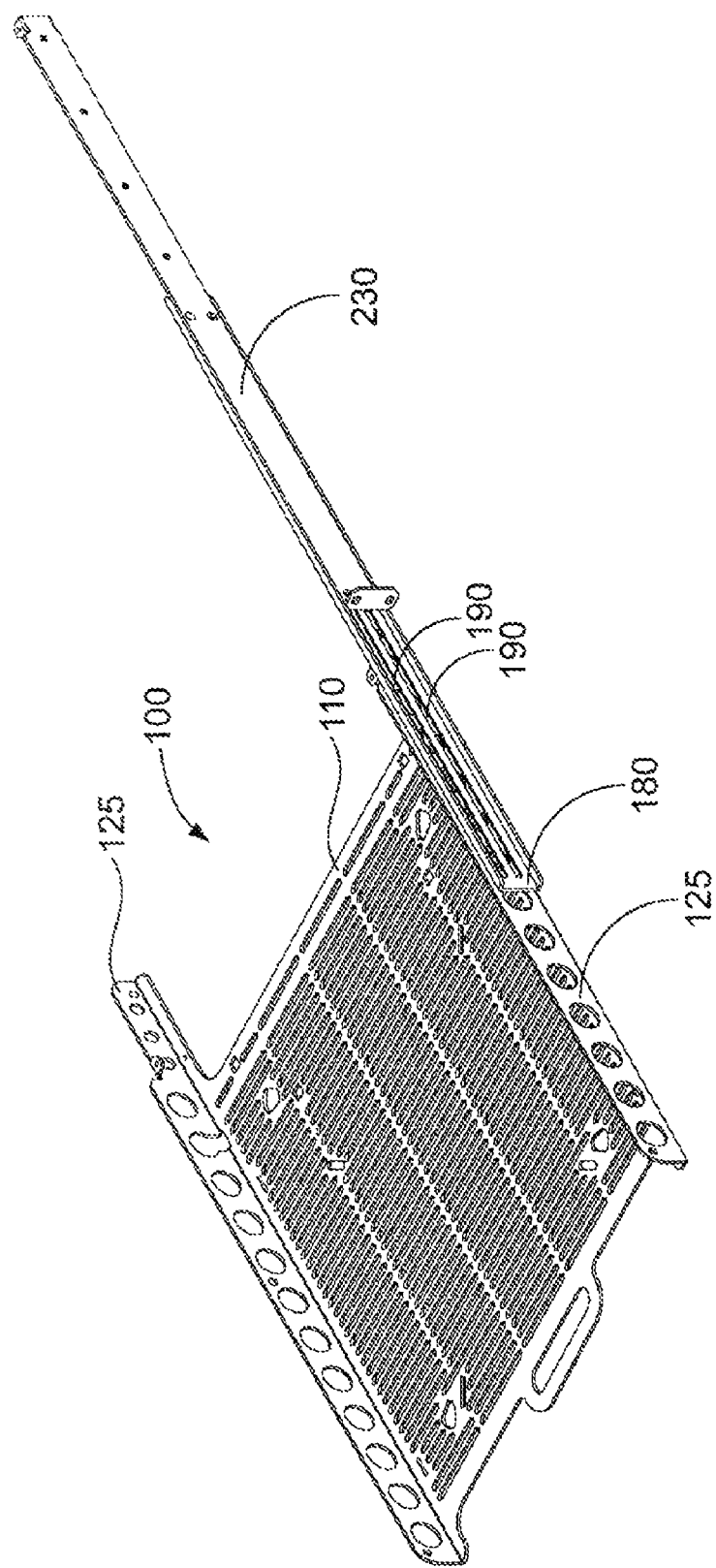
FIG. 6B is a perspective view of an embodiment of the sliding support shelf of the present invention illustrating the shelf in a fully extended position.

As illustrated in FIGS. 6A and 6B, the center slide member 180 is preferably associated with an outer slide member 230. The outer slide member 230 is coupled to the center slide member 180 through remaining slide slots 190 to provide additional extension of the base 110 of the support shelf 100 with respect to the rack. The outer slide member 230 is coupled to the center slide member 180 via the same suitable fasteners, (e.g., screw 210, spacer washer 220) (See FIG. 5), and shoulder washer 225. FIG. 6A illustrates the center slide member 180 fully extended with respect to the base 110 of the support shelf 100. FIG. 6b illustrates the outer slide member 230 also fully extended to provide additional extension of the base 110 of the support shelf 100 with respect to the rack. Accordingly, not only does the center slide member 180 function to extend and retract the support shelf 100, but the outer slide member 230 provides additional extension or retraction depth, providing additional access to the component and associated cables for ease of use/maintenance.

Figure 7:
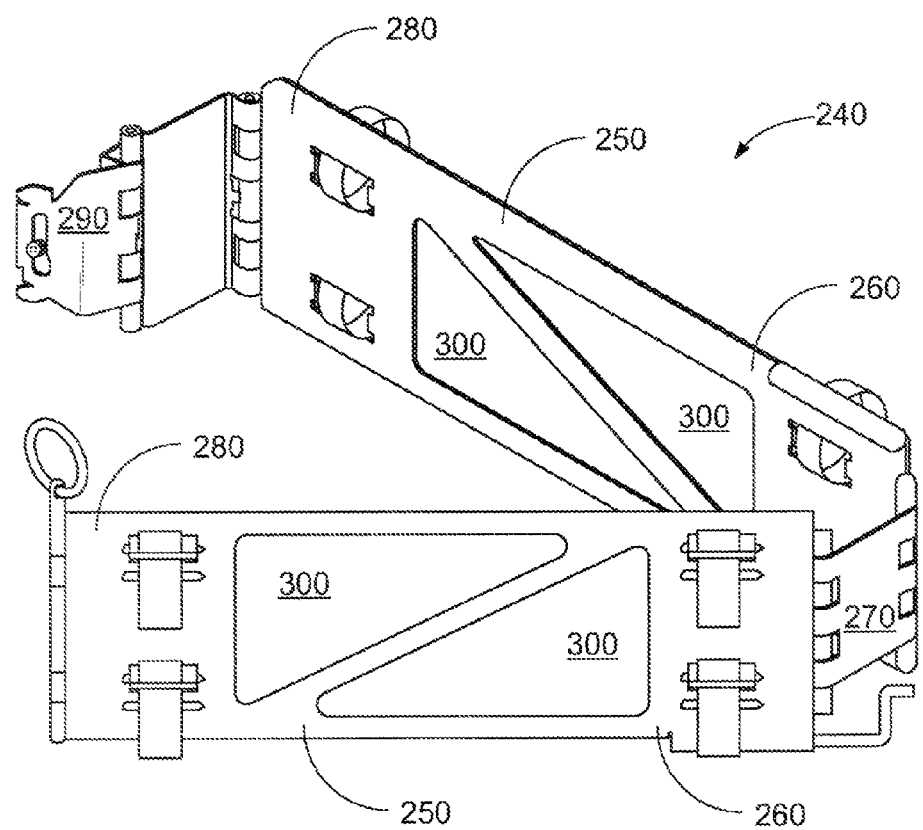
FIG. 7 is a perspective view of an embodiment of the cable management arm of the present invention.
Figure 8:
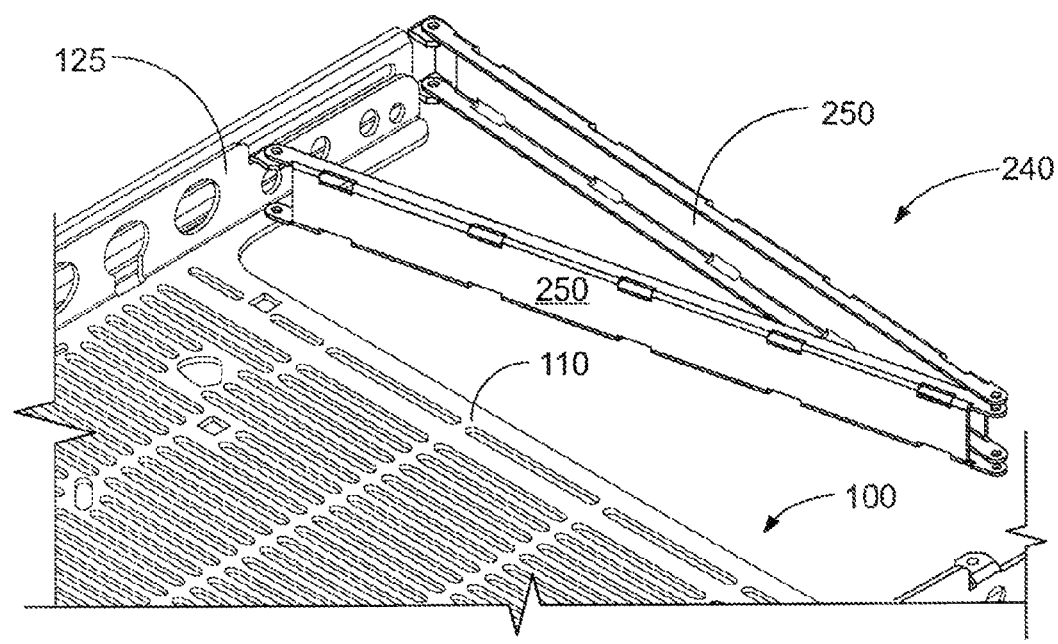
FIG. 8 is a perspective view illustrating attachment of the cable management arm to an embodiment of the present invention sliding support shelf.

Now turning to FIGS. 7 and 8, a cable management device 240 is illustrated. In one embodiment, the cable management device 240 comprises two cable management arms 250 of identical design coupled at their proximal ends 260 by an elbow pivot point 270. The distal ends 280 of the cable management arms 250 are coupled to either the base 110 (of the support shelf 100 via arm attachment flanges 290 or other suitable fasteners, or directly to the rack. Thus, when the support shelf 110 is extended, the cable management arms 250 pivot about the elbow pivot point 270, also extending in relation to the position of the support shelf 100. Preferably, the shape of the cable management arms 250 is a C-channel design. Optionally, the cable management arms 250 may be provided with one of more slots 300 through which cable ties, Velcro™ ties, or the like may be threaded to constrain the cables associated with the equipment components being supported by the support shelf 100.

Figure 9:
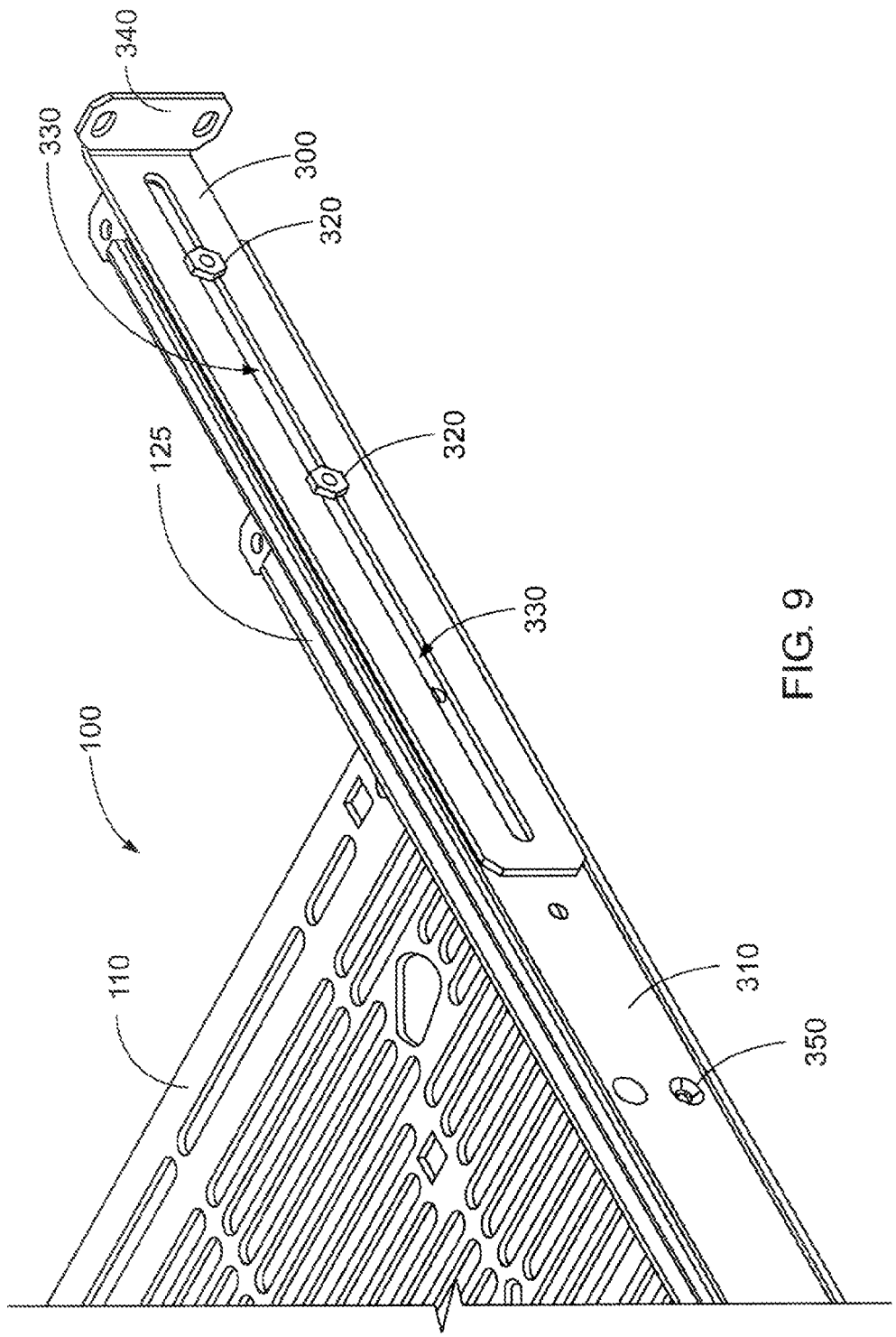
FIG. 9 is a perspective view illustrating the use of a rear slider to allow the sliding support rack of the present invention to be used with racks of varying depths.

Referring now to FIGS. 8 and 9, deflection of the cable management arms 250 via the weight of the cables may be addressed by skewing the attachment angle of one or both cable management arms 250, such that pivot point formed between the cable management arms 250 is elevated. When the orientation of the support shelf 100 is reversed (i.e., is in an upside-down configuration), the cable management arms 250 are attached on an opposing side from the right-side-up configuration, resulting in the same elevation of the pivot point formed between the cable management arms 250 and the attachment point to the base 110 of the support shelf 100.

To accommodate attachment of the support shelf 100 of the present invention to racks of various depths, a rear attachment slider 300 coupled to a rack attachment bracket 310 is provided. As illustrated in FIG. 9, the rear attachment slider 300 slides via suitable fasteners 320 (e.g., shoulder nuts) coupled to the inner slide rails 125 via sliding slot 330. The rear attachment slider 300 includes a rear attachment flange 340, that can be adjusted continuously by moving the rear attachment slider 300 in the sliding slot 330, moving the fasteners 320 to a different series of connection points 350 provided on the rack attachment bracket 310, and/or inverting the direction of the rear attachment slider 300.

Figure 10A:
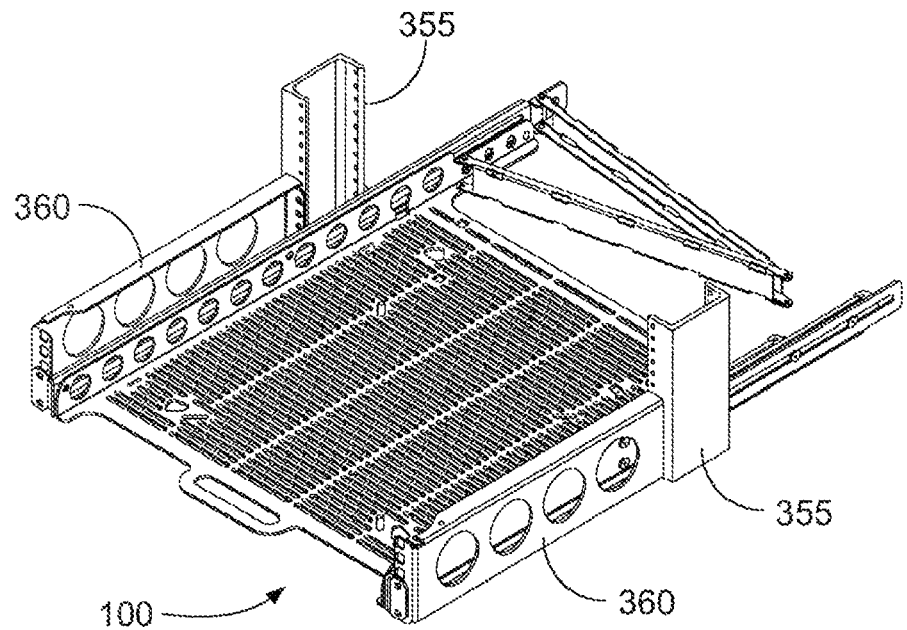
FIG. 10A is a perspective of an embodiment of the sliding support shelf of the present invention as coupled to a two-post rack design (centered position)
Figure 10B:
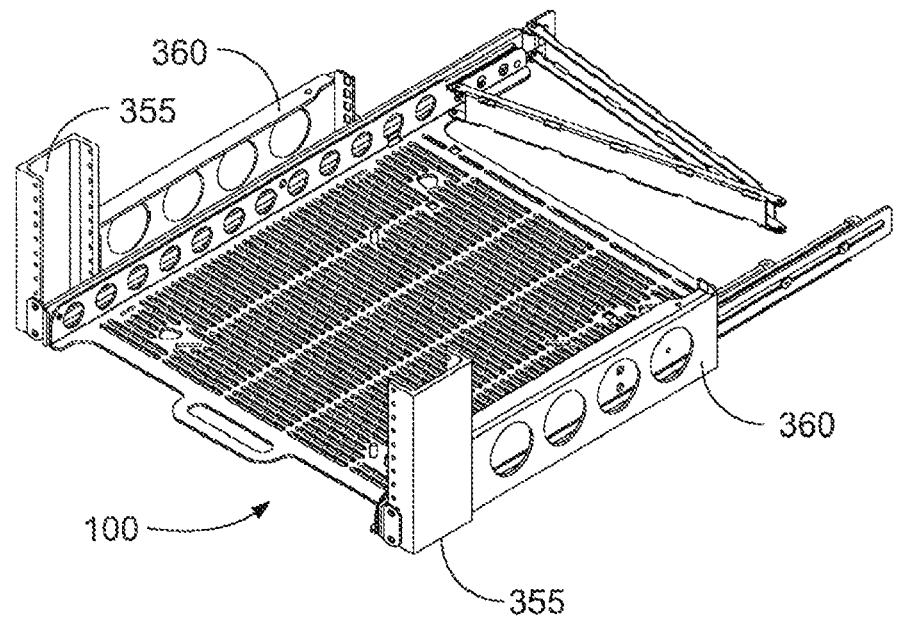
FIG. 10B is a perspective of an embodiment of the sliding support shelf of the present invention as coupled to a two-post rack design (flush position)

Referring now to FIGS. 10A and 10B, there is shown a support shelf 100 of the present invention coupled to a two-post rack system in a centered and flush configuration, respectively. In FIG. 10A, the support shelf 100 is coupled to a two-post rack system 355 utilizing a conversion bracket 360. Using the conversion bracket 360, the rack system 355 is, in effect, extended forward such that the support shelf 100 is centered, when mounted, on the rack system 355. In FIG. 10B, the conversion bracket 360 is used to extend the rack system 355 backwards, thereby allowing the support shelf 100 to be mounted in a position flush with the front of the rack system 355.

Figure 11:
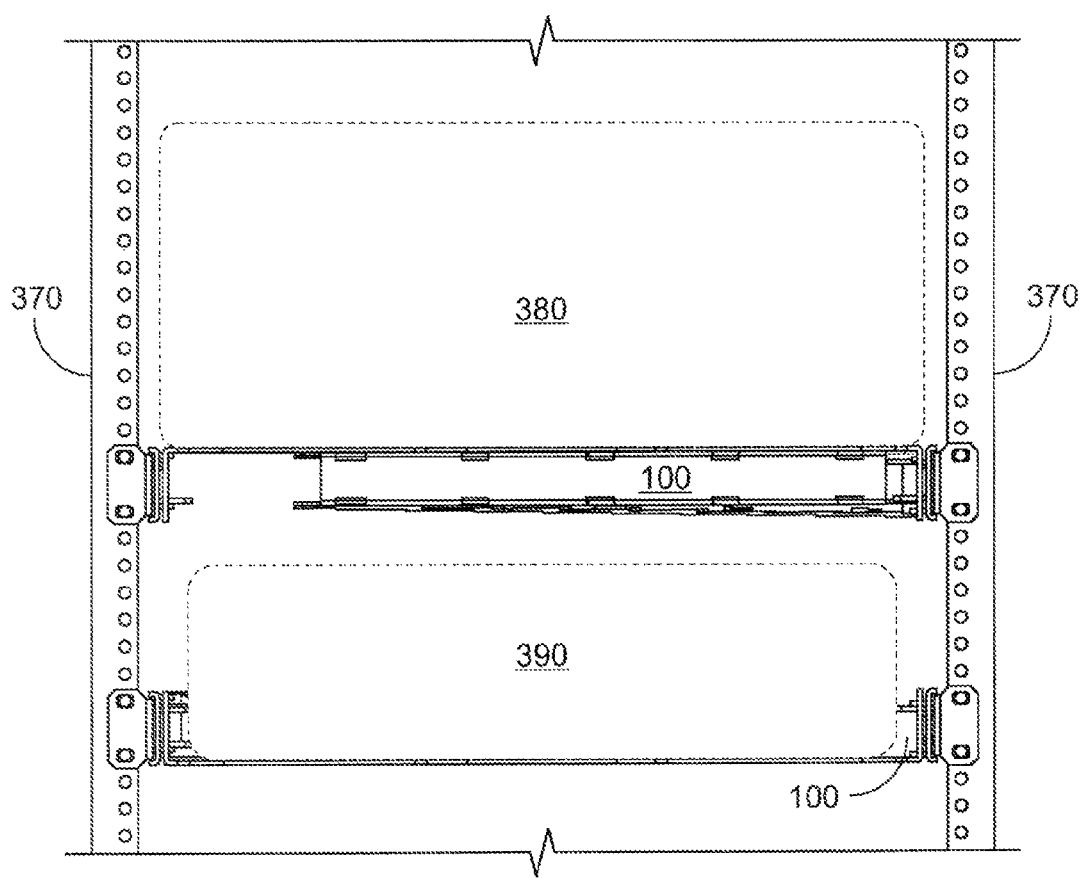
FIG. 11 is a perspective of an embodiment of the sliding support shelf of the present invention as coupled to a four-post rack design, illustrating installation of a relatively narrow component (upper) and a relatively wide component (lower)

In FIG. 11, there is shown two support shelves 100 attached to a four-post rack system 370. Component A 380 is supported by the upper support shelf 100, and Component B 390 is supported by the lower support shelf 100. Component A 380 is relatively wide when compared with the width of Component B 390. Accordingly, the upper support shelf 100 is installed to the rack system 370 in an inverted orientation to accommodate the larger width of Component A 380. Although right side up orientation is preferred (to conserve rack space), the orientation feature of the present invention allows the support shelf 100 to accommodate varying widths of components to be supported.

Now turning to FIG. 12, the present invention method of using the support shelf 100 of the present invention includes the steps of: Step 10—selecting a two-or four-post rack system (a two-post system modified to replicate a four-post system may also be selected) upon which to support a load, like an electronic component; Step 20—select the proper orientation (up side down or right side up) to accommodate the width of the component to be supported by the support shelf 100; Step 30—if a two-post rack system is selected, utilizing a conversion bracket 360 to mount the support shelf 100 in either a centered or flushed position; Step 40—once installed, placing a load, such as a computer and the like, to the base 110 of the support shelf 100 to be supported thereon, and Step 50—optionally, coupling cables and the like associated with the component to be supported to the cable management arms 250 for management thereof.

It is to be appreciated that the support shelf of the present invention may couple to substantially any existing two-or four-post rack system and support loads accordingly. It is to be further appreciated that the support shelf of the present invention provides numerous configurations for supporting a variety of loads, depending on the requirements of the user and dimensions of the loads to be supported. The present invention method may be used to accommodate use of the present invention support shelf with all the various rack systems and configurations thereof A number of embodiments of the invention have been described. Nevertheless, it will be understood that various modifications may be made without departing from the spirit and scope of the invention. Accordingly, other embodiments are within the scope of the following claims.

What is claimed is:

1. A slidable support for a support shelf in a rack system, the slidable support comprising:
    a plurality of fasteners, each fastener including a shaft and at least a first shoulder and a second shoulder;
    a first slide member operable to couple to a base of a support shelf of a rack system and operable to longitudinally translate relative to the base using one or more of at least two slots, each of the at least two slots adapted to receive one or more of the plurality of fasteners so that the one or more fasteners pass through each slot in a direction perpendicular to the direction of longitudinal translation, wherein at least a first one of the at least two slots and one or more first fasteners from the plurality of fasteners couple the base and the first slide member so that:
        the shaft of each of the first fasteners passes through the first slot in a direction perpendicular to the direction of longitudinal translation of the first slide member,
        the first shoulder of each of the first fasteners is on a first side of the first slot to engage the base, and
        the second shoulder of each of the first fasteners is on a second side of the first slot to engage the first slide member; and
    a second slide member operable to couple to the first slide member and operable to longitudinally translate relative to the first slide member using at least a second one of the at least two slots and one or more second fasteners from the plurality of fasteners that couple the first slide member and the second slide member, so that:
        the shaft of each of the second fasteners passes through the second slot in a direction perpendicular to the direction of longitudinal translation of the second slide member,
        the first shoulder of each of the second fasteners is on a first side of the second slot to engage the first slide member, and
        the second shoulder of each of the second fasteners is on a second side of the second slot to engage the second slide member,
    wherein the first slot is substantially parallel to the second slot of the at least two slots.

2. The slidable support of claim 1 wherein the at least two slots include at least four slots and translation of the first slide member relative to the base uses at least four slots, with at least a third one of the at least four slots used together with the first slot for coupling the first slide member to the base, and with at least a fourth one of the at least four slots used together with the second slot for coupling the second slide member to the first slide member, wherein the first, second, third and fourth slots are each substantially parallel to each other.

3. The slidable support of claim 1 wherein the first slide member is adapted to allow horizontally extending the base with respect to a rack of the rack system, and wherein the second slide member is adapted to allow horizontally extending the base relative to the first slide member and with respect to a rack of the rack system.

4. The slidable support of claim 1, wherein the second fasteners, coupling the first slide member and the second slide member, are constructed of a low friction material.

5. The slidable support of claim 1 further comprising an attachment slider capable of coupling to the second slide member, and wherein the attachment slider allows coupling of the support shelf to racks of a plurality of different dimensions in a direction of the relative translation, and wherein the attachment slider includes an attachment flange for coupling the attachment slider to one of the racks.

6. The slidable support of claim 1 wherein the first slide member includes the first slot.

7. The slidable support of claim 1 wherein the first slide member includes the second slot.

8. The slidable support of claim 1 wherein the second slide member includes the second slot.

9. The slidable support of claim 1 further comprising a flange disposed on a lateral end of the second slide member and operable to couple to a post of the rack system.

10. A slideable support of claim 1 wherein the second slide member translates relative to the first slide member using the at least two slots, the at least two slots collectively extending substantially a length of the first slide member and operable to allow the first slide member to translate relative to the second slide member substantially half the length of the first slide member.

* * * * *